(12) United States Patent
Saugier

(10) Patent No.: US 10,978,400 B2
(45) Date of Patent: Apr. 13, 2021

(54) CONDUCTIVE VIAS

(71) Applicant: STMICROELECTRONICS (GRENOBLE 2) SAS, Grenoble (FR)

(72) Inventor: Eric Saugier, Froges (FR)

(73) Assignee: STMICROELECTRONICS (GRENOBLE 2) SAS, Grenoble (FR)

( * ) Notice: Subject to any disclaimer, the term of this patent is extended or adjusted under 35 U.S.C. 154(b) by 46 days.

(21) Appl. No.: 16/390,889

(22) Filed: Apr. 22, 2019

(65) Prior Publication Data

US 2019/0333859 A1    Oct. 31, 2019

(30) Foreign Application Priority Data

Apr. 26, 2018    (FR) ...................................... 1853657

(51) Int. Cl.
*H01L 23/538*    (2006.01)
*H01L 21/768*    (2006.01)
*H01L 23/498*    (2006.01)

(52) U.S. Cl.
CPC .... *H01L 23/5384* (2013.01); *H01L 21/76816* (2013.01); *H01L 21/76871* (2013.01); *H01L 21/76877* (2013.01); *H01L 23/49827* (2013.01); *H01L 23/49844* (2013.01); *H01L 23/5386* (2013.01)

(58) Field of Classification Search
CPC .......... H01L 23/5384; H01L 21/76816; H01L 21/76871; H01L 21/76877; H01L 23/49827; H01L 23/49844; H01L 23/5386; H01L 21/486; H01L 23/147
See application file for complete search history.

(56) References Cited

U.S. PATENT DOCUMENTS

| | | | |
|---|---|---|---|
| 2005/0121768 A1* | 6/2005 | Edelstein .......... | H01L 21/76898 257/698 |
| 2005/0161837 A1* | 7/2005 | Matsui .............. | H01L 23/49833 257/797 |
| 2005/0248002 A1 | 11/2005 | Newman et al. | |
| 2006/0202347 A1 | 9/2006 | Egawa | |
| 2011/0241040 A1 | 10/2011 | Yu et al. | |
| 2012/0007132 A1 | 1/2012 | Chang et al. | |
| 2012/0012855 A1* | 1/2012 | Schellhammer ........ | H01L 33/62 257/76 |
| 2013/0069233 A1* | 3/2013 | Chou .................. | H01L 23/5329 257/751 |
| 2016/0176702 A1* | 6/2016 | Pagani ................. | G01L 9/0045 257/419 |

* cited by examiner

*Primary Examiner* — Fernando L Toledo
*Assistant Examiner* — Adam S Bowen
(74) *Attorney, Agent, or Firm* — Seed Intellectual Property Law Group LLP

(57) ABSTRACT

The disclosure concerns a semiconductor chip, which may be an interposer, having conductive through vias having a parallelepipedal shape.

20 Claims, 4 Drawing Sheets

CONDUCTIVE VIAS

BACKGROUND

Technical Field

The present disclosure concerns electronic chips comprising vias crossing, for example, interposers.

Description of the Related Art

In electronic systems, integrated circuit chips are generally associated with other components, for example, memories, to which they are to be connected. Such connections are for example formed by chips, also called interposers, having as a main function of providing an electric connection between a plurality of integrated circuit chips. Interposers for example comprise a substrate covered, on each side, with an interconnection network, each interconnection network comprising one or a plurality of metallization levels. The substrate is crossed by conductive vias forming connections between the interconnection networks. Thus, the metallization levels allow the connection of chips, for example, microcontrollers and memories, located on a same side of the interposer. Through vias further enable to connect chips located on opposing sides of the interposer.

BRIEF SUMMARY

One or more embodiments are directed to semiconductor chips forming interposers and comprising conductive through vias.

An embodiment provides a chip crossed by conductive vias having a parallelepipedal shape.

According to an embodiment, the chip is an interposer.

According to an embodiment, an assembly of vias substantially forms the contours of a rectangle.

According to an embodiment, the chip comprises a plurality of assemblies of vias, each forming the contours of a rectangle.

According to an embodiment, the conductive vias are made of copper.

Another embodiment provides a method of manufacturing a chip crossed by conductive vias having a parallelepipedal shape.

According to an embodiment, the method comprises a step of thinning a first and a second surface of the chip, to form strips of conductive material extending from the first surface to the second surface.

According to an embodiment, the method comprises: forming a cavity in the chip, from a first surface of the chip; forming a layer of conductive material on the cavity walls; etching the layer of conductive material to form, on the cavity walls, the strips extending from the first surface of the chip to a second surface of the chip; and filling the cavity with a first material.

According to an embodiment, the first material is silicon.

According to an embodiment, the first material is bonded in the cavity by a bonding layer.

According to an embodiment, the first material is a resin.

According to an embodiment, the layer of conductive material is made of a metal.

According to an embodiment, the cavity has a height-to width ratio substantially smaller than 1.

The foregoing and other features and advantages will be discussed in detail in the following non-limiting description of specific embodiments in connection with the accompanying drawings.

DETAILED DESCRIPTION

Figure 1A:
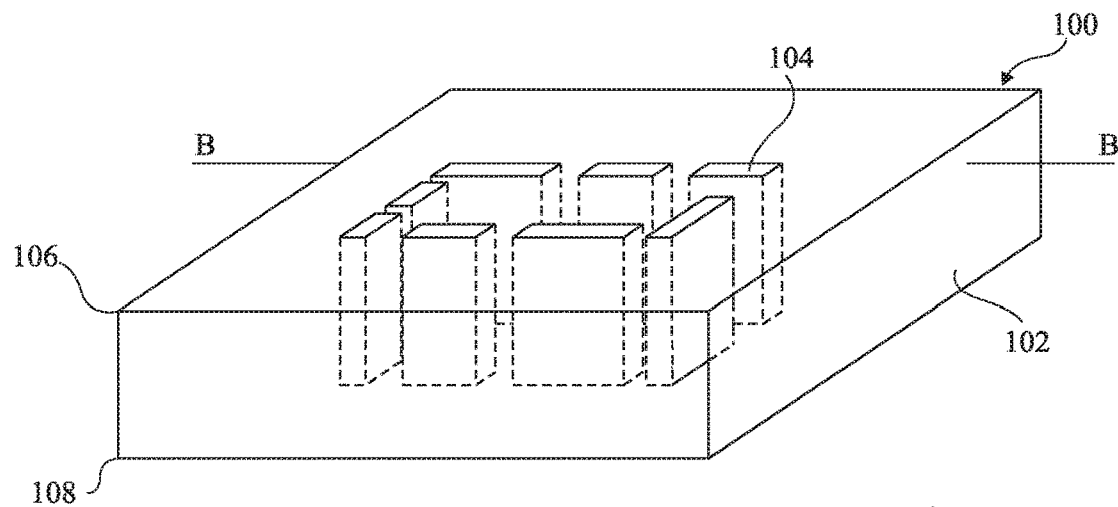
FIGS. 1A and 1B are a perspective view and a cross section view along plane B-B of FIG. 1A, schematically showing an embodiment of a chip comprising conductive vias.

The same elements have been designated with the same reference numerals in the various drawings and, further, the various drawings are not to scale. For clarity, only those steps and elements which are useful to the understanding of the described embodiments have been shown and are detailed. In particular, the different circuits where the described embodiments may be used are not detailed.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., it is referred to the orientation of the concerned elements in the drawings. Unless otherwise specified, the terms "approximately", "substantially", "about", and "in the order of" are used herein to designate a tolerance of plus or minus 10%, preferably of plus or minus 5%, of the value in question.

Interposers are generally used in circuits requiring a high density of vias and high-performance connections. However, for a given thickness, the higher the density of vias, the higher the height-to-width ratio (aspect ratio) of the vias. The higher this ratio, the more expensive the filling of the vias with conductive material and the higher the risk of occurrence of air bubbles in the vias, and thus of a decrease in the performance.

A solution would be to keep vias having a greater diameter. However, the density of vias would then be lower. Further, an increase in the diameter of the vias would result in a longer filling step.

Another solution would be to decrease the thickness of the chip and particularly of the substrate crossed by the vias. However, such a decrease would cause a loss of strength at the level of the substrate, which would then tend to twist. In particular, the displacement or the flipping of the substrate would then require the presence of a chip used as a "handle", that is, a chip having as only function to maintain the shape of the substrate during a movement.

There is a need for a chip comprising through vias overcoming all or part of the disadvantages of existing chips.

Figure 1B:
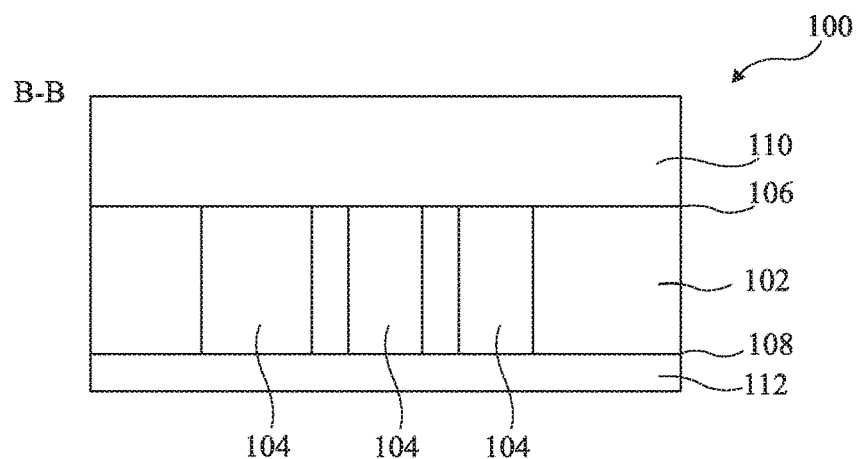

FIGS. 1A and 1B are a perspective view and a cross section view along plane B-B of FIG. 1A schematically showing an embodiment of a chip 100 comprising through vias.

Chip 100 is for example an interposer. Chip 100 comprises a substrate 102, for example, a semiconductor substrate, for example, made of silicon.

Substrate 102 is crossed by electrically-conductive through vias 104. Vias 104 extend from a first surface 106 to a second surface 108 of substrate 102. Vias 104 have a parallelepipedal shape.

Chip 100 further comprises an interconnection network 110 (FIG. 1B, not shown in FIG. 1A) covering first surface 106 of substrate 102 and an interconnection network 112 (FIG. 1B, not shown in FIG. 1A) covering second surface 108 of substrate 102. Interconnection networks 110 and 112, not shown in detail, comprise one or a plurality of metallization levels in one or a plurality of insulator layers. The metallizations of different levels of a same interconnection network are connected together by conductive vias.

Electronic elements, not shown, for example, discrete components, integrated circuit chips, or memories, may be connected to interconnection network 110. Chip 100 may be connected, for example, to another chip, or to a package, not shown, by interconnection network 112. Such electronic elements may thus be connected to the other chip via interconnection networks 110 and 112 and through vias 104.

Interconnection network 110 may for example comprise a plurality of metallization levels, and interconnection network may for example comprise a single metallization level.

The technologies used for interconnection networks 110 and 112 may be different from each other, particularly in terms of dimensions of the interconnections, for example, usual interconnection network (BEOL) or metallization layer (FEOL) technologies.

Vias 104 are arranged in chip 100 to form, in a top view or in a cross-section view along a plane parallel to the first or to the second surface 106 or 108 of substrate 102, the contour of a rectangle (FIG. 1A). More particularly, chip 100 comprises an assembly of vias 104 distributed along four axes forming the four sides of the rectangle.

Although a single assembly of vias 104 has been shown in FIGS. 1A and 1B, an interposer may comprise a plurality of assemblies such as that which has been described. The number of assemblies of vias 104 depends on the number of desired through vias and on the desired locations of these vias.

Similarly, each side of the rectangle formed by vias 104 of FIGS. 1A and 1B arbitrarily comprises from one to three vias. It should be understood that this is an illustration only and that each side may comprise any number of vias, for example, from approximately 1 to approximately 1,000 vias 104.

The height of vias 104 is substantially equal to the thickness of substrate 102. The height of vias 104 is for example greater than approximately 500 µm. Such a thickness enables to ensure the strength of substrate 102 and to avoid the need for a handle during manufacturing steps. Vias 104 for example have, in a plane parallel to the plane of the first or of the second surface 106 or 108 of substrate 102, a width smaller than approximately 5 µm, for example, in the range from approximately 1 to approximately 5 µm. Vias 104 for example have, in the same plane, any length, preferably greater than 1 µm.

Figure 2:
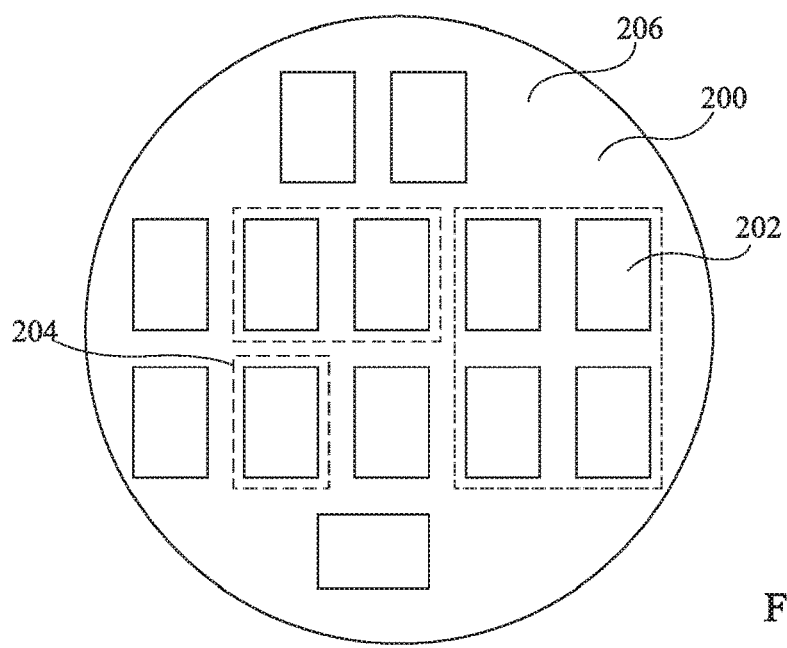
FIG. 2 schematically shows a step of manufacturing chips of FIGS. 1A and 1B.

FIG. 2 schematically illustrates a step of manufacturing of the embodiment of FIGS. 1A and 1B. More particularly, FIG. 2 illustrates a wafer 200 of a substrate, for example, semiconductor, for example, silicon, where a plurality of chips 100 may be formed.

Wafer 200 has a first surface 206 and a second surface 208. Only the first surface 206 is shown in FIG. 2.

During this step, cavities 202 are formed in wafer 200 on the side of first surface 206. The opening of each cavity 202 forms the rectangular shape which will define the pattern of an assembly of vias 104 by its contour.

Wafer 200 is intended to be divided into a plurality of chips. The contours of three examples of future chips are shown in dotted lines having a chip 204, for example, an interposer, comprising a single cavity 202.

Figure 3:
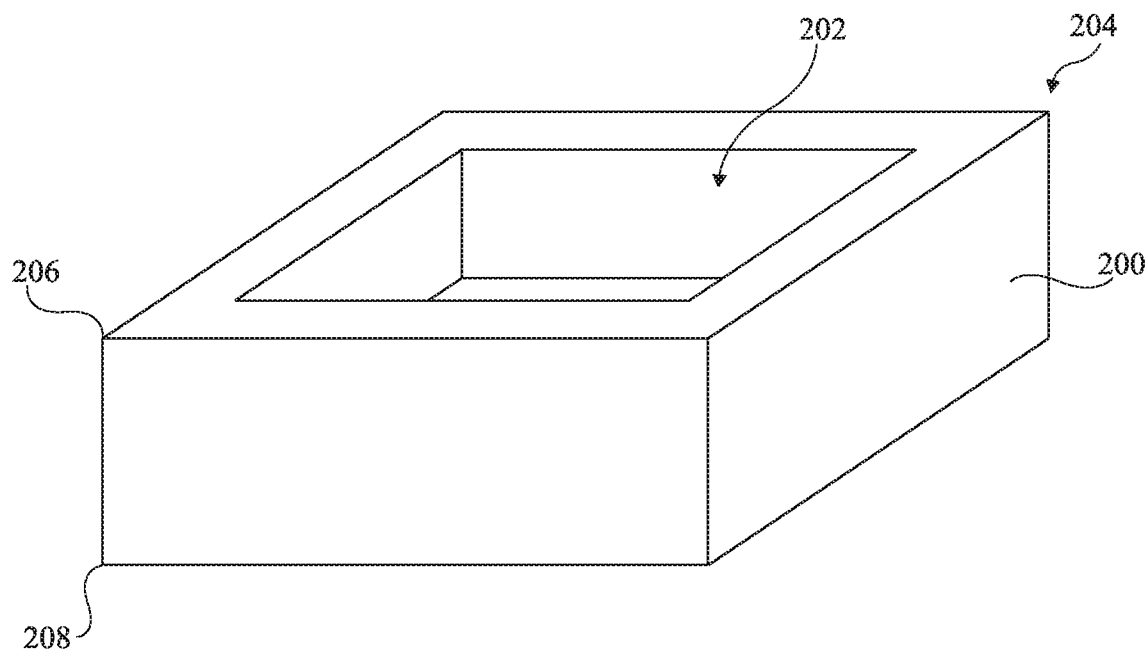
FIG. 3 is a perspective view partially illustrating in further detail the step of FIG. 2.

FIG. 3 is a perspective view illustrating an interposer of FIG. 2. FIG. 3 more particularly shows the interposer 204 of FIG. 2 at the same manufacturing level as that described in relation with FIG. 2. In practice, interposer 204 has not been individualized and thus still forms part of wafer 200.

Interposer 204 thus comprises a cavity 202. The depth of the opening is for example greater than the thickness of the desired interposer. Wafer 200 thus also has a thickness greater than the thickness of the desired interposer.

The thickness of wafer 200 is for example in the range from approximately 700 µm to approximately 800 µm. The depth of cavity 202 is for example in the range from approximately 550 µm to approximately 650 µm. The horizontal dimensions, that is, the dimensions in the plane orthogonal to the smallest dimension of the wafer (the height), of cavity 202 are for example in the range from approximately 1 mm to 10 mm, for example, approximately equal to 5 mm. The dimensions of the cavity are selected according to the desired density of vias.

The height-to-width ratio of cavity 202 is thus smaller than 1. The manipulation of the wafer advantageously requires no handle.

Figure 4:
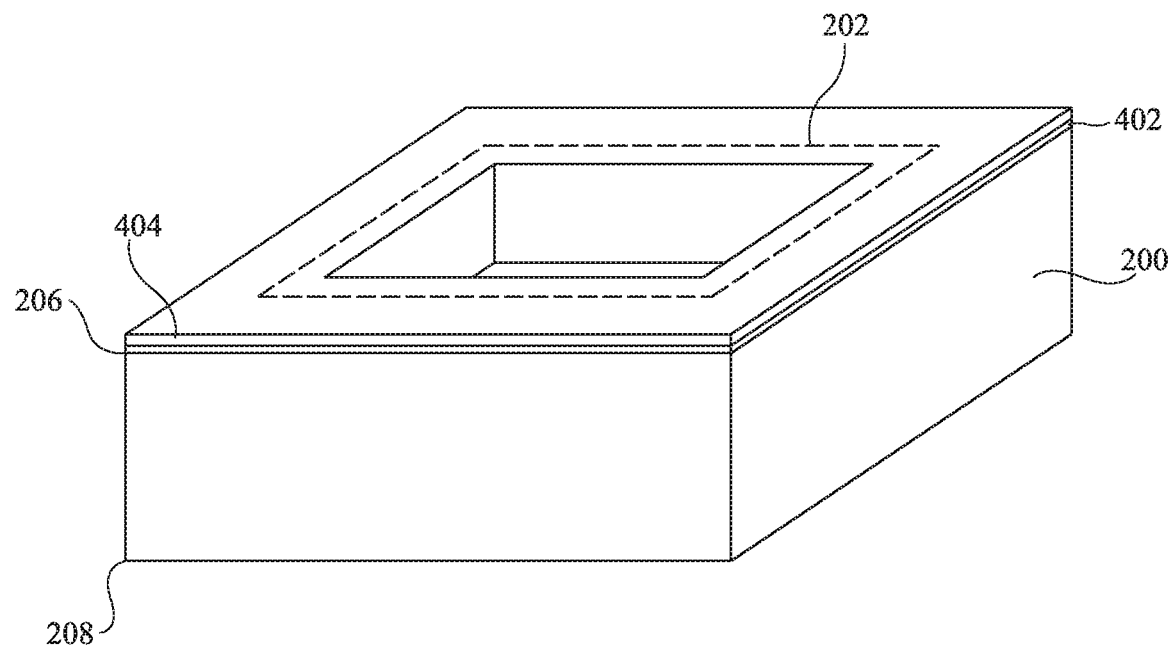
FIG. 4 is a perspective view illustrating another step of manufacturing of the chip of FIGS. 1A and 1B.

FIG. 4 is a perspective view illustrating another manufacturing step of the embodiment of FIGS. 1A and 1B. The opening of cavity 202, described in relation with FIGS. 2 and 3, is shown in dotted lines.

During this step, a layer 402 of insulator is homogeneously deposited on the wafer of substrate 200. Insulator layer 402 covers first surface 206 of wafer 200, the walls of cavities 202, and the bottom of cavities 202. Insulator layer 402 for example has a thickness in the range from approximately 1 µm to approximately 5 µm. Insulator layer 402 is for example made of silicon oxide.

An interface layer 404 (seed layer) is then deposited on insulator layer 402, that is, on first surface 206 of wafer 200, the walls of cavities 202, and the bottom of cavities 202. Interface layer 404 is provided to allow the growth of a conductive material, for example, a metal, for example, copper. Interface layer 404 is for example made of Ti/Cu. Interface layer 404 for example has a thickness in the range from approximately 100 nm to approximately 500 nm.

Figure 5A:
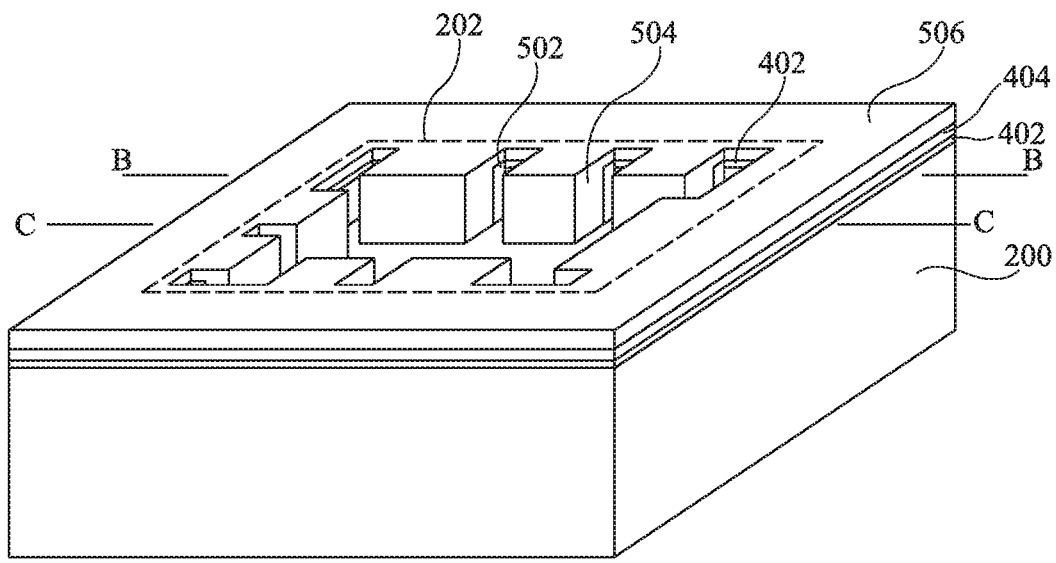
FIGS. 5A, 5B, and 5C are a perspective view and cross section views along planes B-B and C-C of FIG. 5A, illustrating still another step of manufacturing of the chip of FIGS. 1A and 1B.
Figure 5B:
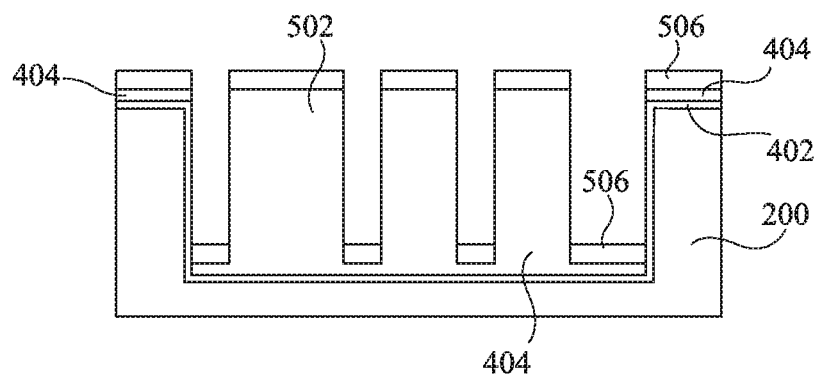
Figure 5C:
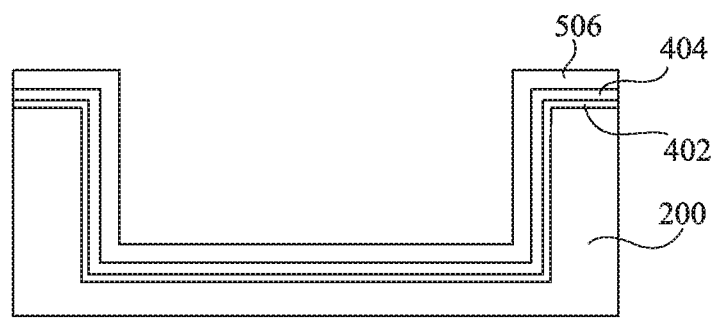

FIGS. 5A, 5B, and 5C are a perspective view and cross section views along planes B-B and C-C of FIG. 5A illustrating still another manufacturing step of the embodiment of FIGS. 1A and 1B.

During this step, portions of interface layer 404 located on the walls of each cavity 202 are etched to form strips 502 of conductive material extending from the opening of the cavity to the bottom of cavity 202. The etching is for example carried out by laser. Each strip 502 will correspond to a conductive via. The number and the location of strips 502 are thus determined according to the number and the location of the conductive vias which are desired to be obtained.

A conductive material, for example, a metal, for example, copper, is then formed by growth from interface layer 404 and in particular from strips 502. Strips 504 of conductive material are thus formed from strips 502. The conductive material may also form on interface layer 404 located at the bottom of cavity 202 and on first surface 206 of wafer 200.

Figure 6A:
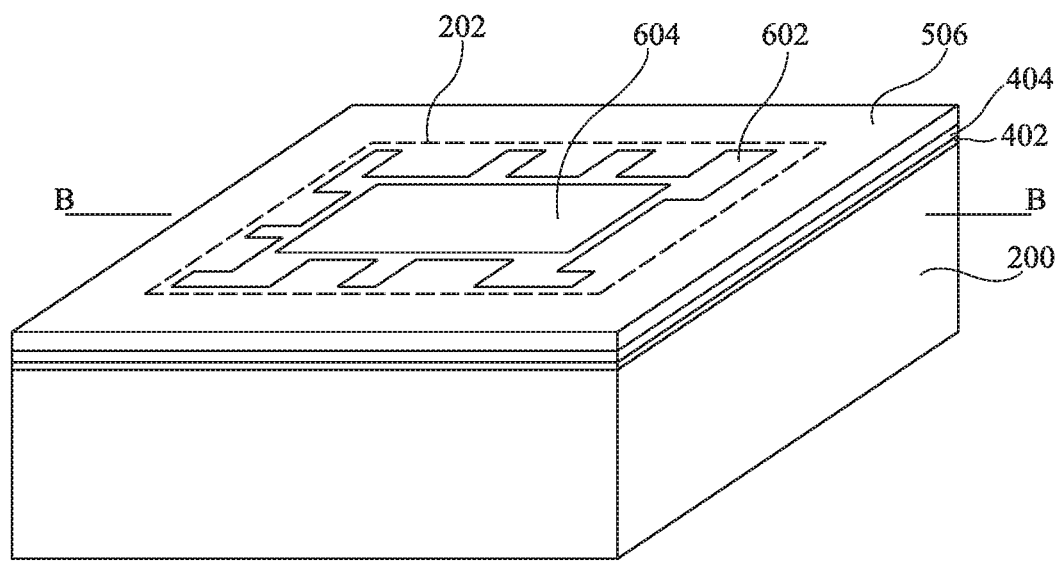
FIGS. 6A and 6B are a perspective view and a cross section view along plane B-B of FIG. 6A of still another step of manufacturing of the chip of FIGS. 1A and 1B.
Figure 6B:
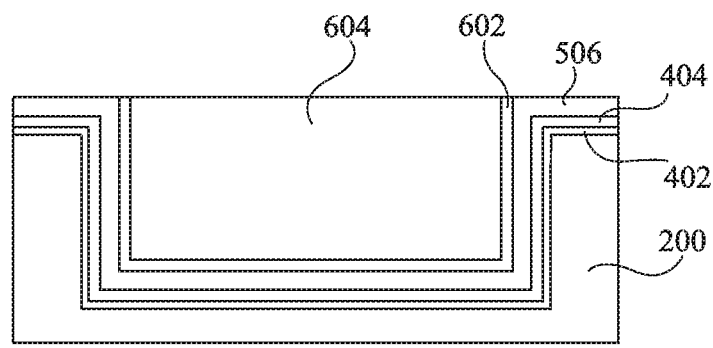
Figure 7:
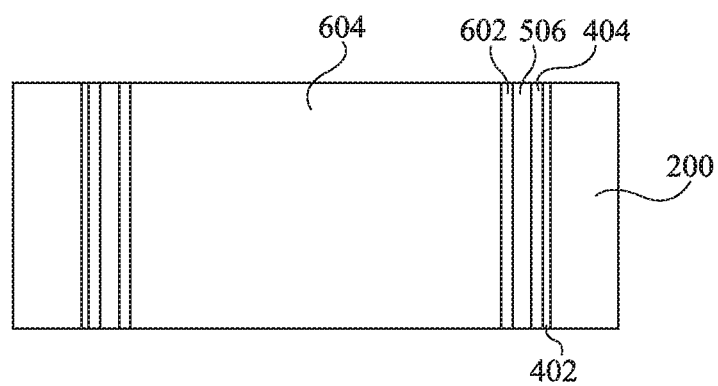
FIG. 7 is a cross-section view along the same plane as FIG. 6B of still another step of manufacturing of the chip of FIGS. 1A and 1B.

FIGS. 6A and 6B are a perspective view and a cross section view along plane B-B of FIG. 6A of another step of manufacturing of the embodiment of FIGS. 1A and 1B.

A bonding material 602 is placed in cavity 202. The bonding material is for example an electrically-insulating glue, for example, an epoxy glue.

A block 604 of semiconductor material, preferably the material of the substrate, for example, made of silicon, is placed in cavity 202. The shape of block 604 is for example substantially parallelepipedal. The quantity of bonding material 602 is selected so that, once block 604 has been placed, cavity 202 is totally filled, as is the case in FIGS. 6A and 6B. Preferably, the quantity of bonding material 602 overflows from cavity 202. Similarly, the height of the block is selected to reach at least the level of the first surface of substrate 200, as in FIGS. 6A and 6B, preferably to exceed the level of the first surface of substrate 200.

Block 604 may possibly comprise active components which have been formed before the placing of block 604 in cavity 202. Active components may also be formed in block 604 and in the substrate around cavity 202 during a subsequent manufacturing step.

It is advantageous to use the same material as the substrate material for block 604. Indeed, the block and the substrate then have the same characteristics, which is advantageous in terms of reliability.

According to an alternative embodiment, block 604 and glue 602 are replaced with a filling resin. The use of a resin is less expensive and faster than bonding a block of semiconductor material in the cavity. However, the substrate and the resin then do not have the same characteristics.

Wafer 100 is then thinned on the side of the first surface and on the side of the second surface of the substrate to remove the bottom of the cavity and all the layers which cover it and to remove the layers covering the first surface of the substrate. Thus, there only remains of interface layer 404 strips 502 and of the conductive material strips 504 having their upper and lower portions exposed.

An advantage of the described embodiments it that it is possible to obtain a desired density of vias for a time and a financial cost smaller than the manufacturing cost of current vias. Indeed, it is possible to form vias of smaller dimensions (smaller than approximately 5 μm) than the dimensions of current technologies (approximately from 8 to 10 μm)). It is further less expensive to form a metal layer covering the walls of a cavity than to fill many cavities.

Another advantage is that the substrate thickness may be sufficient to avoid having to use a handle.

Specific embodiments have been described. Various alterations, modifications, and improvements will occur to those skilled in the art. In particular, although the description mainly mentions interposers, the described embodiments apply to any chip comprising through vias.

Further, although the opening of cavity 202 is preferably rectangular, it is possible to form cavities having an opening of different shape, for example, a triangular shape or a polygonal shape.

Various embodiments with different variations have been described hereabove. It should be noted that those skilled in the art may combine various elements of these various embodiments and variations.

Such alterations, modifications, and improvements are intended to be part of this disclosure, and are intended to be within the spirit and the scope of the present disclosure. Accordingly, the foregoing description is by way of example only and is not intended to be limiting.

In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor chip comprising:
   a body of semiconductor material having a first surface and a second, opposite surface; and
   a plurality of conductive through vias extending from the first surface of the body to the second surface of the body, each conductive through via of the plurality of conductive through vias having a parallelepipedal shape, the plurality of conductive through vias being arranged to form an assembly that in plan view at the first and second surfaces substantially forms contours of a rectangle.

2. The semiconductor chip of claim 1, wherein the semiconductor chip is an interposer.

3. The semiconductor chip of claim 1, wherein at least some of the conductive through vias of the assembly have different orientations from each other.

4. The semiconductor chip of claim 1, wherein the plurality of through vias are arranged in a plurality of assemblies, each assembling having a set of the plurality of through vias arranged so that in plan view form contours of a rectangle.

5. The semiconductor chip of claim 1, wherein the conductive through vias are made of copper.

6. A method comprising:
   forming a plurality of cavities at a first surface of a semiconductor chip;
   forming an insulator layer in the plurality of cavities;
   forming a seed layer on the insulator layer in the plurality of cavities; and
   growing a conductive material from the seed layer to form a plurality of conductive vias, each conductive via having a parallelepipedal shape.

7. The method of claim 6, further comprising thinning the semiconductor chip at a second surface to expose the conductive material and form a plurality of conductive through vias.

8. The method of claim 7, further comprising:
   etching the seed layer to form, on walls of the plurality of cavities, first strips extending from the first surface of the chip to a second surface of the chip; and
   forming second conductive strips on the first strips.

9. The method of claim 6, wherein the semiconductor chip is a silicon chip.

10. The method of claim 8, wherein the first material is bonded in the cavity by a bonding layer.

11. The method of claim 8, wherein the first material is a resin.

12. The method of claim 7, wherein conductive material is a metal.

13. The method of claim 7, wherein the cavity has a height-to-width ratio substantially smaller than 1.

14. The method of claim 6, wherein forming the plurality of cavities comprises etching the chip to form the plurality of cavities.

15. A method comprising:
   forming a cavity at a first surface of a semiconductor chip, the cavity having a parallelepipedal shape;
   forming an insulator layer in the cavity;
   forming a seed layer on the insulator layer in the cavity;
   forming at least one strip in the seed layer, the at least one strip extending from the cavity; and
   growing a conductive material from the seed layer to form a conductive via.

16. The method of claim 15, further comprising thinning the semiconductor chip at a second surface to expose the conductive material and to form a conductive through via.

17. The method of claim 15, wherein the semiconductor chip is a silicon chip.

18. The method of claim 15, wherein the insulator layer is silicon oxide.

19. The method of claim 15, wherein the conductive material is a metal.

20. The method of claim 19, wherein conductive material is copper.

\* \* \* \* \*